(12) United States Patent
Chen

(10) Patent No.: US 7,702,980 B2
(45) Date of Patent: Apr. 20, 2010

(54) SCAN-LOAD-BASED DYNAMIC SCAN CONFIGURATION

(76) Inventor: Xinghao Chen, 2925 Holly La., Endwell, NY (US) 13760-1550

( * ) Notice: Subject to any disclaimer, the term of this patent is extended or adjusted under 35 U.S.C. 154(b) by 0 days.

(21) Appl. No.: 12/321,170

(22) Filed: Jan. 16, 2009

(65) Prior Publication Data
US 2009/0132882 A1 May 21, 2009

Related U.S. Application Data

(63) Continuation of application No. PCT/US2007/016088, filed on Jul. 16, 2007.

(60) Provisional application No. 60/831,261, filed on Jul. 14, 2006.

(51) Int. Cl.
G01R 31/28 (2006.01)
G06F 11/00 (2006.01)
G11C 19/00 (2006.01)

(52) U.S. Cl. .................... 714/726; 714/30; 377/64

(58) Field of Classification Search .................. None
See application file for complete search history.

(56) References Cited

U.S. PATENT DOCUMENTS

| 4,493,077 | A | 1/1985 | Agrawal et al. | 714/731 |
|---|---|---|---|---|
| 5,068,881 | A * | 11/1991 | Dervisoglu et al. | 377/70 |
| 6,265,894 | B1 | 7/2001 | Reblewski et al. | 326/39 |
| 6,662,324 | B1 * | 12/2003 | Motika et al. | 714/726 |
| 7,191,373 | B2 | 3/2007 | Wang et al. | 714/729 |
| 7,305,603 | B1 * | 12/2007 | Stenfort | 714/727 |

OTHER PUBLICATIONS

International Search Report and associated documents.

* cited by examiner

*Primary Examiner*—Christine T Tu
(74) *Attorney, Agent, or Firm*—Bernard S. Hoffman

(57) ABSTRACT

A scan-load-based (SLB) dynamic scan configuration reconfigures scan structures via scan-load operation, thereby eliminating interconnect network distributing configuration signals, and employs common scan circuitry identical for designs at mask level and is suitable for ASIC implementations. The architecture includes reconfigurable scan cells, apparatus for distributing configuration data to the reconfigurable scan cells and for determining desired reconfiguration data for each of the reconfigurable scan cells, and a configuration-set (CS) signal. Each of the reconfigurable scan cells has a pass-through (PT) mode in which data input, either a scan-in (SI) or a system-data (SD) of the scan cell, is transparently passed to a scan-out (SO) terminal of the scan cell without requiring a pulse on a shift clock (SC). The configuration-set (CS) signal communicates with each of the reconfigurable scan cells. A pulse on the configuration-set (CS) signal triggers PT Hold latches to capture configuration data from corresponding slave latches, which in turn set configurations of each of the reconfigurable scan cells.

12 Claims, 10 Drawing Sheets

SE: Scan_Enable; SI: Scan_In; SO: Scan_Out;
SD: System_Data; SC: System_Clock.

SE: Scan Enable; SI: Scan In; SO: Scan Out;
SC: Scan Clock; CS: Configuration Set

```
1   set SE; //** BEGIN with default configuration
2   scan_load(n);
3   reset SE;
4   ......
5   set SE;
6   scan_unload(n)/load(n);
7   reset SE;
8   ......
9   set SE;
10  scan_unload(n)/load(n, <configuration_1>);
11  pulse CS;
12  scan_load(n_1);
13  reset SE;
14  ......
15  set SE;
16  scan_unload(n_1)/load(n_1);
17  reset SE;
18  ......
19  set SE;
20  scan_unload(n_1)/load(n_1, <all-0>);
21  //** add set SI=0 here if scan cell 1 was in PT mode
22  pulse CS;
23  scan_load(n, <configuration_i>);
24  pulse CS;
25  scan_load(n_i);
26  reset SE;
27  ......
28  set SE;
29  scan_unload(n_i)/load(n_i);
30  reset SE;
31  ......
32  set SE;
33  scan_unload(n_i)/load(n_i, <all-0>);
34  //** add set SI=0 here if scan cell 1 was in PT mode
35  pulse CS;
36  scan_load(n, <configuration_q>);
37  pulse CS;
38  scan_load(n_q);
39  reset SE;
40  ......
41  set SE;
42  scan_unload(n_q)/load(n_q);
43  reset SE;
44  ......
45  set SE;
46  scan_unload(n_q)/load(n_q, <all-0>);
47  //** add set SI=0 here if scan cell 1 was in PT mode
48  pulse CS;
49  reset SE;
```

A Pseudo-Code Example of SLB Scan Reconfiguration Procedure

FIG. 7

6 PARALLEL SCAN CHAINS OF LENGTH n

Pseudo-Code Procedure Illustrating Scan Operations
Beginning with SLB Scan Reconfiguration Procedure

```
1    set SE;
2    scan_load_6(n, 0101......0101);
3    pulse CS;
4    scan_load_6(m);
5    ......
6    scan_unload_6(m)/load_6(m);
7    ......
8    scan_unload_6(m)/load_6(m, 000......000);
9    pulse CS;
10   reset SE;
```

An 8-Bit MUX-Based Serial Scan Block

An SLB 8-Bit 4x2 Scan Block

```
1    set SE; // ** BEGIN with default configura
2    scan_load(8);
3    reset SE;
4    ......
5    set SE;
6    scan_unload(8)/load(8);
7    reset SE;
8    ......
9    set SE;
10   scan_unload(8)/load(10000000);
11   //** #1 RSS-2 is to be set to PT mode
12   pulse CS; //** set configuration #1
13   scan_load(6);
14   reset SE;
15   ......
16   set SE;
17   scan_unload(6)/load(6);
18   reset SE;
19   ......
20   set SE;
21   scan_unload(6)/load(001000);
22   //** #3 RSS-2 is to be set to PT mode
23   set SI=1; //** to keep #1 RSS-2 in PT mode
24   pulse CS; //** set configuration #2
25   scan_load(4);
26   reset SE;
27   ......
28   set SE;
29   scan_unload(4)/load(4);
30   reset SE;
31   ......
32   set SE;
33   scan_unload(4)/load(0000);
34   set SI=0; //** #1 RSS-2 is to be set to shift mode
35   pulse CS; //** set configuration #0
36   scan_load(00100000);
37   //** RSS-2 #2 is to be set to PT mode
38   pulse CS; //** set configuration #3
39   scan_load(6);
40   reset SE;
41   ......
42   set SE;
43   scan_unload(6)/load(6);
44   reset SE;
45   ......
46   set SE;
47   scan_unload(6)/load(000010);
48   //** RSS-2 #4 is to be set to PT mode
49   pulse CS; //** set configuration #4
50   scan_load(4);
51   reset SE;
52   ......
53   set SE;
54   scan_unload(4)/load(4);
55   reset SE;
56   ......
57   set SE;
58   scan_unload(4)/load(0000);
59   pulse CS;
60   reset SE; //** END SCAN
```

Figure 10. Pseudo-Code Example of SLB Dynamic Scan Configuration with an SLB 8-Bit 4x2 Scan Block

METHOD OF DYNAMICALLY CONFIGURING SCAN STRUCTURES
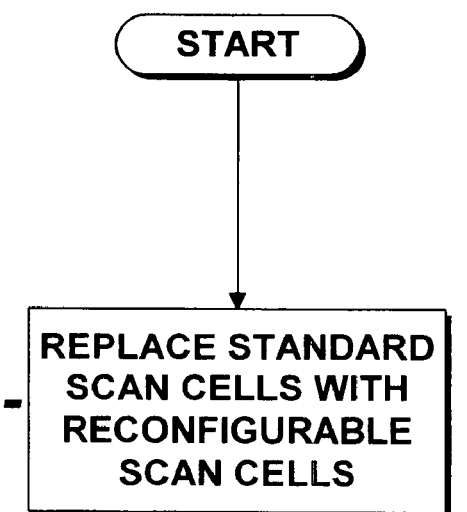
STEP 1A --- REPLACE STANDARD SCAN CELLS WITH RECONFIGURABLE SCAN CELLS
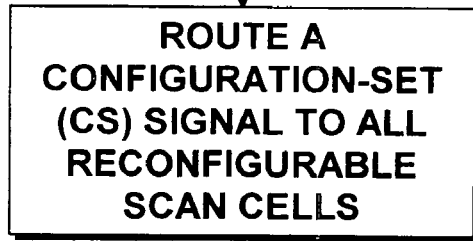
STEP 1B --- ROUTE A CONFIGURATION-SET (CS) SIGNAL TO ALL RECONFIGURABLE SCAN CELLS
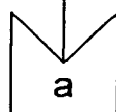
FIG. 11-A

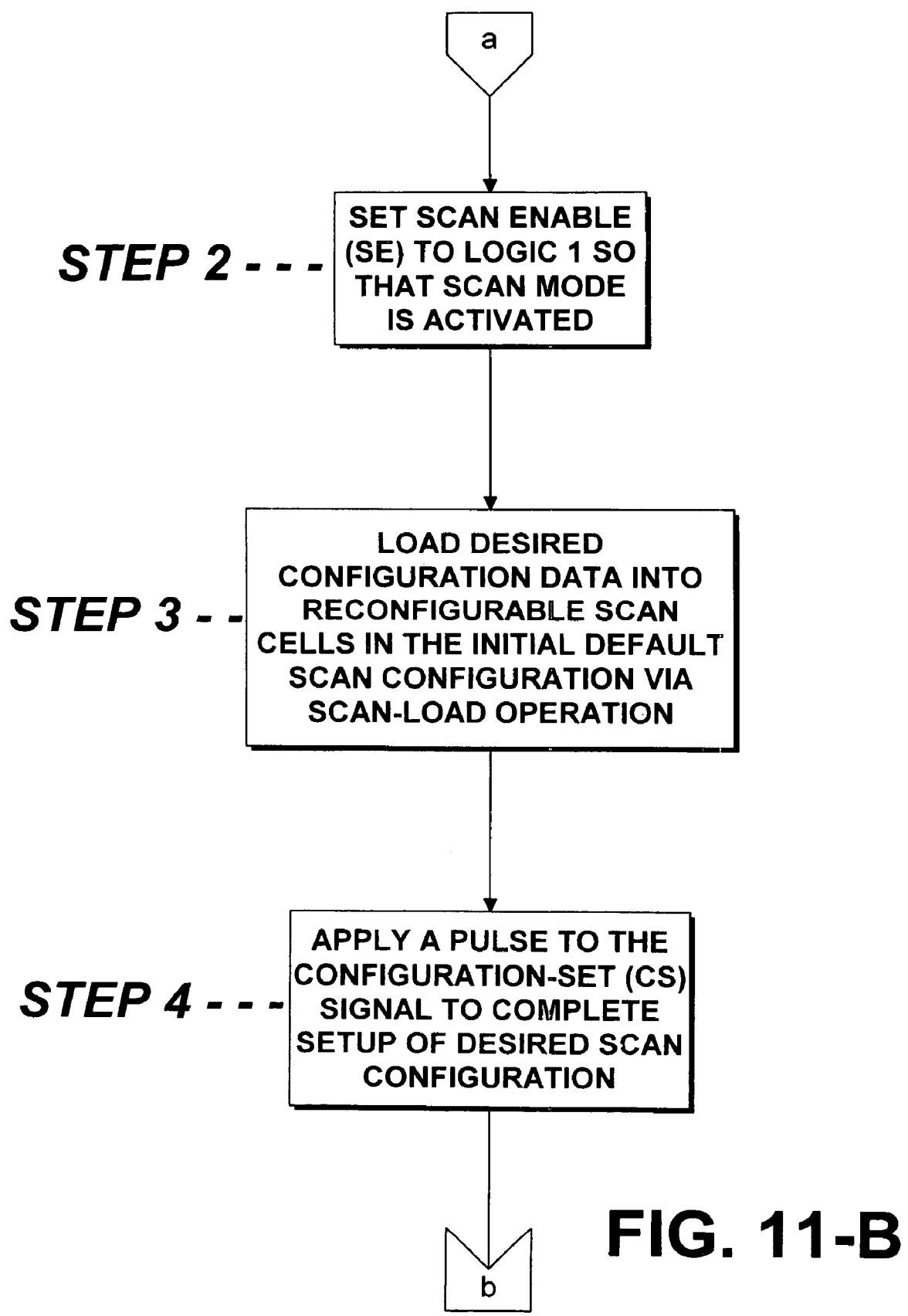
FIG. 11-B

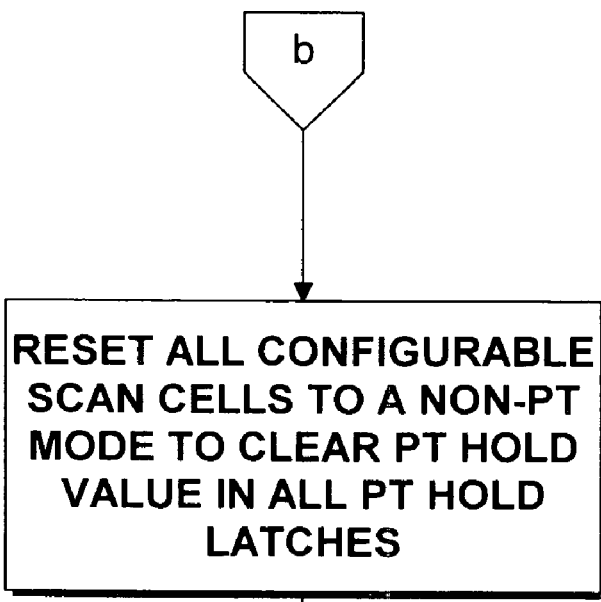
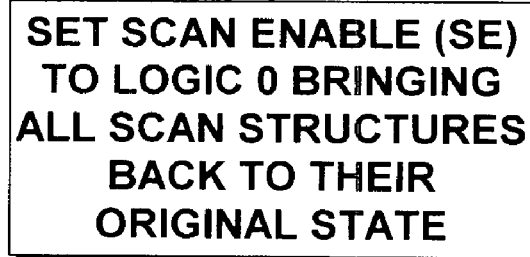
FIG. 11-C

SCAN-LOAD-BASED DYNAMIC SCAN CONFIGURATION

THE CROSS REFERENCE TO RELATED APPLICATIONS

The instant nonprovisional patent application is a continuation of, and claims priority from, International Application Number PCT/US2007/016088, filed on Jul. 16, 2007, by Xinghao Chen, which in turn claims priority from provisional patent application No. 60/831,261, filed on Jul. 14, 2006, by Xinghao Chen, and which are both incorporated herein by reference thereto.

THE BACKGROUND OF THE INVENTION

A. The Field of the Invention

The embodiments of the present invention relate to a scan configuration, and more particularly, the embodiments of the present invention relate to a scan-load-based dynamic scan configuration.

B. The Description of the Prior Art

Various scan design methodologies[1] have been successfully used in digital systems and credited with improved testability, reduced cost of test and diagnosis, reduced time for process and system debugging, better system maintenance and serviceability, etc., among many manufacturing-critical and system develop metrics.[2] Scan structures provide access points for controllability and observability to internal circuits, and are also essential to many test and test data compression techniques, such as STUMPS,[3] the Illinois Scan Architecture,[4] and SmartBIST,[5] and many other well-known scan methods.[6] Scan structures are typically customized on silicon for individual designs. With these techniques, scan configurations—once the circuit structures are placed on silicon— cannot be changed in post-silicon processes, such as test, diagnosis, and debug, limiting the space for optimal efficiency and effectiveness of these applications.

[1] E. B. Eichelberger and T. W. Williams, "A Logic Design Structure for LSI Testing," in the Proceedings of the 14th Design Automation Conference, pp. 462-468, June, 1977; E. B. Eichelberger and T. W. Williams, "A Logic Design Structure for LSI Testability," Journal of Design Automation & Fault-Tolerance Computing, Vol. 2, No. 2, pp. 165-178, May, 1978; E. B. Eichelberger, T. W. Williams, E. I. Muehldorf, and R. G. Walther, "A Logic Design Structure for Testing Internal Array," in the Proceedings of the 3rd USA-JAPAN Computer Conference, pp. 266-272, October, 1978; A. Kobayashi, S. Matsue and H. Shiba, "Flipflop Circuit with FLT (Fault-Location-Technique) Capability," (in Japanese) in the Proceedings of IECEO Conference, pp. 962, 1968; Y. Miyagi, A. Kobayashi, and K. Kitano, "Hardware System of NEAC Series 2200 Model 700," (in Japanese) Paper Technology Group, IECE, Japan, TGOEC71-3, April 1971.
[2] S. DasGupta, R. G. Walther, and T. W. Williams, "An Enhancement to LSSD and Some Applications of LSSD in Reliability, Availability, and Serviceability," in the Digest of Papers of the 11th Annual International Symposium on Fault-Tolerant Computing, pp. 32-34, June 1981; W. C. Carter, H. C. Montgomery, R. J. Presis and H. J. Reinheimer, "Design of Serviceability Features for the IBM System/360," IBM Journal of Research & Development, pp. 115-126, 1964; K. Maling and E. L. Allen, "A Computer Organization and Programming System for Automated Maintenance," IEEET-EC: 63, pp. 887-895; J. H. Stewart, "Application of Scan/Set for Error Detection and Diagnostics," in the Digest of Papers of Semiconductor Test Conference, pp. 152-158, 1978.
[3] P. H. Bardell and W. H. McAnney, "Self-Testing of Multiple Logic Modules," in the Digest of Papers of International Test Conference, pp. 200-204, November 1982; P. H. Bardell and W. H. McAnney, "Parallel Pseudorandom Sequences for Built-in Test," in the Proceedings of International Test Conference, pp. 302-308, October 1984; P. H. Bardell and W. H. McAnney, "Simultaneous Self-Testing System," U.S. Pat. No. 4,513,418, Apr. 23, 1985.
[4] I. Hamzaoglu and J. H. Patel, "Reducing Test Application Time for Full Scan Embedded Cores," in the Proceedings of IEEE International Symposium on Fault Tolerant Computing, 1999, pp. 260-267; I. Hamzaoglu and J. H. Patel, "Reducing Test Application Time for Built-in Self-Test Test Pattern Generators," in the Proceedings of IEEE VLSI Test Symposium, pp. 369-375, 2000.
[5] B. Koenemann et al., "Logic DFT and Test Resource Partitioning for 100M Gate ASICs," presentation at the Test Resource Partitioning Workshop (TRP), 2000; B. Koenemann, C. Barnhart, B. Keller, T. Snethen, O. Farnsworth, and D. Wheater, "A SmartBIST Variant with Guaranteed Encoding," in the Proceedings of the 10th Asian Test Symposium, pp. 325-332, 2001.
[6] M. S. Abadir and M. A. Breuer, "Scan Path with Look Ahead Shifting," in the Proceedings of International Test Conference, pp. 165-170, June, 1985; M. S. Abadir, "Efficient Scan Path Testing Using Sliding Parity Response Compaction," in the Proceedings of International Conference on Computer Aided Design, pp. 332-335, November, 1987; K. T. Cheng and V. D. Agrawal, "An Economical Scan Design for Sequential Logic Test Generation," in the Proceedings of 19th International Symposium on Fault-Tolerant Computing, pp. 28-35, June 1989; S. DasGupta, P. Goel, R. G. Walther, and T. W. Williams, "A Variation of LSSD and Its Implications on Design and Test Pattern Generation in VLSI," in the Proceedings of International Test Conference, pp. 63-66, November 1982; S. P. Morley and R. A. Malett, "Selectable Length Partial Scan: A Method to Reduce Vector Length," in the Proceedings of the International Test Conference, pp. 385-392, 1991; C. Barnhart, V. Brunkhorst, F. Distler, O. Farnsworth, B. Keller, and B. Koenemann, "OPMISR: The Foundation for Compressed ATPG Vectors," in the Proceedings of the International Test Conference, pp. 748-757, October 2001; C. Barnhart, V. Brunkhorst, F. Distler, O. Farnsworth, A. Ferko, B. Keller, D. Scott, B. Koenemann, and T. Onodera, "Extending OPMISR beyond 10× Scan Test Efficiency," IEEE Design & Test of Computers, pp. 65-72, Vol. 19, No. 5, September/October 2002.

Dynamically reconfigurable scan chains[7] can effectively reduce the cost of test. With dynamic scan, a MUX is placed at the output of a scan cell. When selected, the MUX can direct the scan-in to by-pass the scan cell. To reduce the use of the MUX blocks, a MUX may be used to by-pass a segment of a scan chain. Dynamic scan can also be applied to parallel scan chains. Random access scan (RAS) methods[8] reduce test time and power consumption, as well as overcoming many other disadvantages associated with the classic serial scan, by enabling each scan cell to be uniquely and randomly addressable. The outputs of selected scan cells can also be directed to primary outputs for observation. These methods use large amount of interconnect resources to distribute many configuration or decoded address signals. Other MUX-based scan configuration techniques, such as the CircularScan[9] and Virtual Scan Chains,[10] have also been described to reduce test cost.

[7] S. Narayanan and M. Breuer, "Optimal Configuring of Multiple Scan Chains," IEEE Transactions on Computers, Vol. 42, No. 9, pp. 1121-1131, September 1993; S. Narayanan and M. Breuer, "Reconfiguration Techniques for a Single Scan Chain," IEEE Transactions on Computer-Aided Design of Integrated Circuits and Systems, Vol. 14, No. 6, pp. 750-765, 1995; A. R. Pandey and J. H. Patel, "Reconfiguration Techniques for Reducing Test Time and Test Data Volume in Illinois Scan Structure Based Designs," in the Proceedings of IEEE VLSI Test Symposium, pp. 9-15, 2002; S. Samaranayake, N. Sitchinava, R. Kapur, M. B. Amin, and T. W. Williams, "Dynamic Scan: Driving Down the Cost of Test," IEEE Computer, pp. 63-68, October 2002; S. Samaranayake, E. Gizdarski, N. Sitchinava, F. Neuveux, R. Kapur, M. B. Amin, and T. W. Williams, "A Reconfigurable Shared Scan-in Architecture," in the Proceedings of IEEE VLSI Test Symposium, 00. 9-14, 2003.
[8] H. Ando, "Testing VLSI with Random Access Scan," in the Proceedings of the COMPCON, pp. 50-52, February 1980; K. D. Wagner, "Design for Testability in the AMDAHL 580," in the Proceedings of the COMPCON, pp. 384-388, 1983; D. H. Baik, K. K. Saluja, and S. Kajihara, "Random Access Scan: A Solution to Test Power, Test Data Volume and Test Time," in the Proceedings of the 17th International Conference on VLSI Design, pp. 883-888, January 2004; A. S. Mudlapur, V. D. Agrawal and A. D. Singh, "A Random Access Scan Architecture to Reduce Hardware Overhead," in the Proceedings of International Test Conference, Paper 15.1, November 2005.
[9] B. Arslan and A. Orailoglu, "Test Cost Reduction through a Reconfigurable Scan Architecture," in the Proceedings of the International Test Conference, pp. 945-952, October 2004; B. Arslan and A. Orailoglu, "CircularScan: A Scan Architecture for Test Cost Reduction," in the Proceedings of the Design Automation and Test in Europe Conference and Exhibition, pp. 1290-1295, 2004.
[10] A. Jas, B. Pouya and N. A. Touba, "Virtual Scan Chains: A Means for Reducing Scan Length in Cores," in the Proceedings of the IEEE VLSI Test Symposium, pp. 73-78, April 2000.

Pre-structured, such as standard-cell, and pre-manufactured, such as FPGA, platforms, have been the main implementation vehicles for ASIC designs. Integration of design-for-test (DFT) circuit structures, such as scan circuits, is often executed based on individual designs, requiring DFT engineer(s) to insert and configure scan structures into each design. As large designs often contain more than 250 k scan cells, this DFT effort adds additional design development time and sometimes interferes with timing and other design issues, such as interconnect routing contention. It is important to point out that, with current practices, manufacturing test related circuitry is implemented as part of a design and during the design development process.

It is desirable to share a large number of manufacturing masks between individual ASIC designs. This is not only to reduce manufacturing cost, but also to maintain the quality and predictability of manufacturing process. Therefore, it seems to make every sense to embed all manufacturing test related circuit structures in implementation platforms, so that scan configuration is no longer a design issue and masks containing manufacturing test circuitry are fixed in each platform. This requires a scan-load-based dynamic scan configuration that reconfigures scan structures via scan-load operation, to thereby eliminate interconnect network distributing configuration signals that can be later reconfigured for individual designs in after-silicon applications, such as test, diagnosis and design debug. The above mentioned various MUX-based dynamic scan methods are not good candidates for this scan-load-based dynamic scan configuration that reconfigures scan structures via scan-load operation, to thereby eliminate interconnect network distributing configuration signals because more or less these methods use interconnect, and hence additional routing space, to distribute configuration signals.

Thus, there exists a need for a scan-load-based dynamic scan configuration that reconfigures scan structures via scan-load operation, to thereby eliminate interconnect network distributing configuration signals having minimum hardware and reconfiguration operation overhead.

Some of the concerns with the above mentioned MUX-based approaches are centered with the use of potentially large interconnect network to distribute dynamic configuration signals to each and every scan cells or segments. This direct-control via PIs provides the most flexibility to reconfigure and/or manipulate scan data, with the cost of using considerable interconnect routing space. Other concerns are related to signal integrity that may be affected by the distribution network which is likely to contain many long interconnects.

On the other hand, scan-load (a.k.a. scan-in) operation is used to shift data into scan cells. Therefore, it can be used to distribute reconfiguration signals to the scan cells. This would eliminate the distribution network used by MUX-based methods. To use scan-load operation to distribute reconfiguration signals reconfigurable scan cells or segments must be able to hold configuration data and maintain the reconfigured scan configuration for normal scan load and unload (a.k.a. scan-out) operations. This hold function can be implemented by integrating existing scan cell designs with a small hold block.

The following three United States Patents were cited in the International Search Report of applicant's corresponding PCT International Patent Application number PCT/US2007/016088:

(1) The U.S. Pat. No. 4,493,077 to Agrawal et al.

The U.S. Pat. No. 4,493,077 issued to Agrawal et al. on Jan. 8, 1985 in U.S. class 714 and subclass 731 teaches a large scale sequential integrated circuit made amenable to scan design testing by inclusion of special multiplexing and storage circuits that respond to a pair of test control pulses to reconfigure the circuit to include one or more shift registers and to step the scan test data through the shift registers. In particular, the pair of test control pulses are applied to the two terminals to which, in normal operation, are applied to the clock pulses that are used to control the storage elements and which, in this operation, are never both simultaneously high. To initiate the scan test operation, these test control pulses are made simultaneously high and the circuitry responds to the conditions.

(2) The U.S. Pat. No. 6,265,894 to Reblewski et al.

The U.S. Pat. No. 6,265,894 issued to Reblewski et al. on Jul. 24, 2001 in U.S. class 326 and subclasss 39 teaches an integrated circuit including a plurality of logic elements (LEs), each of which having a plurality of outputs, and a partial scan register. The plurality of LEs are operative to generate a plurality of output signals in response to a plurality of input signals correspondingly applied to the LEs. The partial scan register is reconfigurably coupled to select ones of the LEs so that, when enabled, the partial scan register is operative to capture and output on a scan bus a record of signal state values circuit elements emulated by the selected LEs in a particular clock cycle of an operating clock. The partial scan register is enabled with application of a scan clock appropriately scaled to the operating clock.

(3) The U.S. Pat. No. 7,191,373 to Wang et al.

The U.S. Pat. No. 7,191,373 issued to Wang et al. on Mar. 13, 2007 in U.S. class 714 and subclass 729 teaches a method and apparatus for inserting design-for-debug (DFD) circuitries in an integrated circuit to debug or diagnose DFT modules, which includes scan cores, memory BIST (built-in self-test) cores, logic BIST cores, and functional cores. A DFD controller is used for executing a plurality of DFD commands to debug or diagnosis the DFT modules embedded with the DFD circuitries. When used alone or combined together, these DFD commands will detect or locate physical failures in the DFT modules in the integrated circuit on an evaluation board or system using a low-cost DFT debugger. A computer-aided design (CAD) method is further developed to synthesize the DFD controller and DFD circuitries according to the IEEE 1149.1 Boundary-scan Std. The DFD controller supports, but is not limited to, the following DFD commands: RUN_SCAN, RUN_MBIST, RUN_LBIST, DBG_SCAN, DBG_MBIST, DBG_LBIST, DBG_FUNCTION, SELECT, SHIFT, SHIFT_CHAIN, CAPTURE, RESET, BREAK, RUN, STEP, and STOP.

THE SUMMARY OF THE INVENTION

Thus, an object of the embodiments of the present invention is to provide a scan-load-based (SLB) dynamic scan configuration, which avoids the disadvantageous of the prior art.

Briefly stated, another object of the embodiments of the present invention is to provide a scan-load-based (SLB) dynamic scan configuration, to thereby eliminate interconnect network distributing configuration signals, and employ common scan circuitry identical for designs at mask level and is suitable for ASIC implementations. The architecture includes reconfigurable scan cells, apparatus for distributing configuration data to the reconfigurable scan cells and for determining desired reconfiguration data for each of the reconfigurable scan cells, and a configuration-set (CS) signal. Each of the reconfigurable scan cells has a pass-through (PT) mode in which data input, either a scan-in (SI) or a system-data (SD) of the scan cell, is transparently passed to a scan-out (SO) terminal of the scan cell without requiring a pulse on a shift clock (SC). The configuration-set (CS) signal communicates with each of the reconfigurable scan cells. A pulse on the configuration-set (CS) signal triggers PT Hold latches to capture configuration data from corresponding slave latches, which in turn set configurations of each of the reconfigurable scan cells.

The novel features considered characteristic of the embodiments of the present invention are set forth in the appended claims. The embodiments of the present invention themselves, however, both as to their construction and their method of operation together with additional objects and advantages thereof will be best understood from the following description of the specific embodiments when read and understood in connection with the accompanying drawing.

THE BRIEF DESCRIPTION OF THE DRAWINGS

The various figures of the drawing are briefly described as follows:

FIG. 1 is a schematic diagram of a typical MUX-based scan DFF;[11]

[11] IBM Microelectronics Division, "LSSD Level-Sensitive Scan Design Introduction." Class Notes, ©2000.

FIG. 7 is a pseudo-code example of SLB scan reconfiguration procedure;

FIG. 9 is an 8-bit MUX-based serial scan block and its 4×2 SLB dynamic scan replacement;

FIG. 10 is a pseudo-code example of SLB dynamic scan configuration with an 8-bit 4×2 embodiments of the present invention block; and FIGS. 11A-11C are a flow chart of the method of dynamically configuring scan structures of the embodiments of the present invention.

THE DETAILED DESCRIPTION OF THE PREFERRED EMBODIMENTS

A. The Configuration

Figure 1:
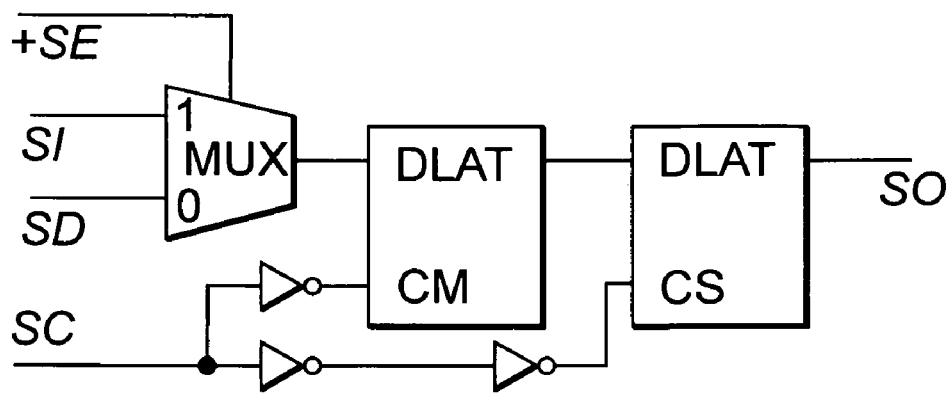

Proven scan methodologies, as already mentioned, remain to be the main DFT vehicles in ASIC design implementations for years to come, and a scan-load-based dynamic scan configuration that reconfigures scan structures via scan-load operation, to thereby eliminate interconnect network distributing configuration signals that are to be defined at the implementation platform level.

The embodiments of the present invention employ scan-load operation to distribute configuration data to scan cells before a configuration-set signal, which is distributed to each reconfigurable scan cell or segment (a small section of scan cells in adjacent/consecutive shift positions) is applied to set the new configuration into effect. After the scan-load, the configuration data captured in each scan cell indicates whether or not the scan cell is to be set to a pass-through (PT) mode in the new configuration. After the configuration-set signal is applied, scan structures can be operated in the new configuration until the next reconfiguration to take place. Other than the configuration-set signal, no additional inputs are needed for dynamic scan configuration.

The embodiments of the present invention require scan cells with a PT mode, in which a scan cell functions as a virtual wire—the scan-in (SI) signal of the scan cell passes freely to the scan-out (SO) of the scan cell. The PT mode is implemented through gating the scan shift clock at the scan cells. For each reconfigurable scan cell or segment a PT hold (PTH) latch is used to keep the reconfigurable scan cell or segment in the PT mode. The output of the PTH latch gates the scan shift clock to the master-slave latches of the scan cell.

The embodiments of the present invention comprise the following three components:

Reconfigurable scan cells with PT mode. When set into the PT mode, the SI input of a scan cell passes to its SO output freely. One way to implement the PT mode with a scan cell is to gate the scan shift clock.

Distributing scan configuration data to reconfigurable scan cells via scan load operation. Upon the completion of the configuration data load (CDL), scan cells having logic 1 are to be set to the PT mode and scan cells having logic 0 are to be set to the normal scan shift mode. This scan-load-based (SLB) dynamic scan reconfiguration procedure eliminates the need of a distribution network. This is in contrast to the MUX-based dynamic scan methods, with which a number of configuration inputs, as well as a distribution network to the MUX blocks, are used. An all-0 CDL, followed by a pulse applied to a configuration-set (to be defined below) signal, will reset the scan structures to the default configuration, in which none of the scan cells are set to the PT mode. When there is a global reset with the scan cells, it can also be used to reset the scan structures to the default configuration in the place of CDL.

A configuration-set (CS) signal is used to complete a reconfiguration after a CDL. Subsequent scan operations are performed in the new configuration until the next pulse is applied to the configuration-set (CS) signal.

Regarding the reconfigurable scan cells, a classic scan cell—one example of which is shown in FIG. 1, which is a schematic diagram of a typical MUX-based scan DFF—has two work modes: the scan mode in which a scan cell together with other scan cells operate as shift register in one or more chains, and the functional (a.k.a. system) mode in which a scan cell operates as a flipflop in processing functional or system data of computational tasks. A logic 1 on the scan enable (SE) terminal sets the scan cell into the scan mode, while a logic 0 sets the scan cell to the functional mode.

Figure 2:
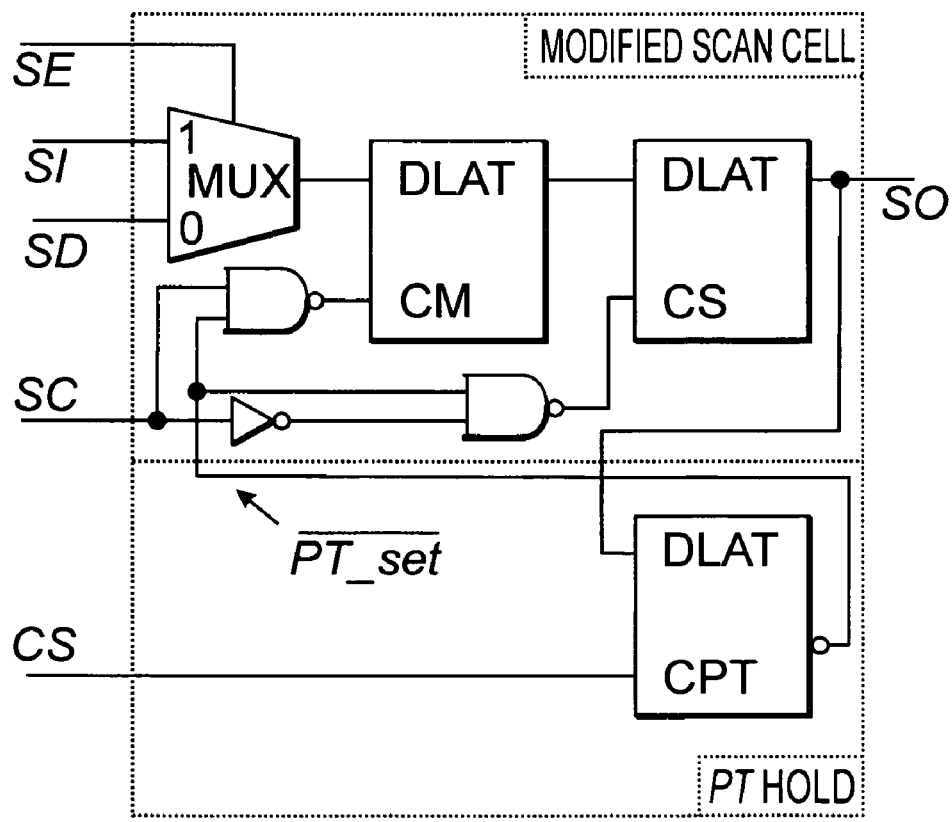
FIG. 2 is a schematic diagram of a MUX-scan DFF integrated with PT mode.

In addition to the scan and functional modes, a reconfigurable scan cell has a third mode called the pass-through (PT) mode in which a data input either the scan-in (SI) or the system-data (SD) of the scan cell is transparently passed to the scan-out (SO) terminal of the scan cell without requiring a pulse on the clock (SC). This concept is illustrated in FIG. 2, which is a schematic diagram of a MUX-scan DFF integrated with PT mode, based on the classic scan cell example shown in FIG. 1.

To set reconfigurable scan cells to the PT mode, first the reconfigurable scan cells are loaded with configuration data via a scan-load operation—cells having logic 1s are meant that they are to be set to the PT mode and cells having logic 0s are meant not to be set to the PT mode. Once reconfiguration data is loaded to the reconfigurable scan cells, a pulse on the configuration-set (CS) signal will capture the configuration data into the PT hold latches such that those having logic 1s will disable the SC clock to the latches of the corresponding reconfigurable scan cells therefore setting them to the PT mode. To release reconfigurable scan cells from the PT mode, the data input, either SI or SD, must be set to logic 0. A pulse on CS would capture this logic 0, which in turn freeing the shift clock (SC) from PT gating to arrive at the clock pins of the master and slave latches and set the reconfigurable scan cell back to either the normal scan shift or the functional mode.

Note that there can be many variations on how the PT mode is implemented. For example, the PT hold latch—the DLAT in FIG. 2—can take input from the Q-bar output—not shown in FIG. 2 but commonly understood that it is available—of the slave latch or one of the outputs of the master latch. Sometimes latches are available with RESET, which can be used to reset the reconfigurable scan cells as well. In the above description, capture of logic 1s in the PT hold latches is used to set reconfigurable scan cells to the PT mode. It is entirely possible to use logic 0 to the same—only need to modify that clock gating circuit a little. Although the example shown in FIG. 2 is based on a classic D-type MUX-based scan cell, the concept of the PT mode can be implemented similarly with other types of scan cell designs to integrate the PT mode.

Reconfigurable scan cells are connected to each other to form scan chain(s) in the same way that classic scan methods do.

The reconfigurable scan cell adds an additional pass-through (PT) mode to a standard scan cell. In the PT mode, a scan cell is digitally transparent between one of its data inputs either the scan-in input or the functional (a.k.a. system) input and its scan-out (SO) output. This means that in the PT mode, data at one of the scan cell inputs is directly passed onto its SO output without requiring a shift clock pulse. The PT mode can be implemented in many different ways. The implementation of the PT mode and the integration with standard scan cell designs are best illustrated with the classic and widely-used D-type MUX-based scan cell design, as shown in FIG. 1. Two of the three inverters, one is the master latch clock path and the other in the slave latch clock path as shown in FIG. 1, are replaced with 2-input NAND gates as shown in FIG. 2. In FIG. 2, a D-type latch is added to the classic scan cell design to serve as the PT Hold latch. It takes input from the output (a.k.a. scan-out) of the slave latch. When the PT Hold latch holds logic 0 at its Q-bar output, it forces logic 1 to appear at the clock pins of the master and slave latches hence setting the scan cell to the PT mode in which both the master and the slave latches are transparent. It takes two steps to reconfigure the scan cell: Step 1 is to load configuration data into the scan cell itself, preferably via the scan-load (a.k.a. scan-in) operation requiring SE to be set to logic 1 to enable the scan mode or via the functional input requiring SE to be logic 0. Once the configuration data is in the scan cell, a pulse applied to the CS signal captures the configuration data into the PT Hold latch—a logic 1 indicates the scan cell is to be set to the PT mode and a logic 0 otherwise. Note that the pulse applied to CS must not overlap with pulses applied to SC, which is a basic design principle known to practitioners.

Regarding the distribution of configuration data to reconfigurable scan cells, this component is of operation procedure rather than circuit hardware. Desired reconfiguration data is determined for each reconfigurable scan cell. With the example reconfigurable scan cell design as shown in FIG. 2, a logic 1 bit in the configuration data means the scan cell in the corresponding scan shift bit position is to be set to the PT mode. To distribute configuration data, the scan-load operation is used to shift configuration data into reconfigurable scan cells. The data is now considered as configuration data.

Regarding the configuration-set (CS) signal, the configuration-set (CS) signal is wired to every reconfigurable scan cell. A pulse on CS triggers the PT Hold latches to capture configuration data from corresponding slave latches with the example shown in FIG. 2, which in turn set the configurations of each reconfigurable scan cell.

The reconfigurable scan cells, the distribution of configuration data to reconfigurable scan cells, and the configuration-set (CS) signal work together in symphony to allow dynamically configuring reconfigurable scan structures.

FIG. 1 shows the typical MUX-based scan D-Flip-Flop (DFF). The PT mode can be implemented by gating the scan shift clock (SC, when in the scan mode).

FIG. 2 shows an example of integrating the PT mode with the MUX-based scan DFF. The circuit is divided into two blocks, labeled as "Modified Scan Cell" (MSC) and "PT Hold" (PTH), respectively. The two inverters feeding the clock pins of the master and slave latches are replaced with 2-input NAND gates. A PTH latch is used to hold the internal PT state for each reconfigurable scan cell or segment. When the scan cell is loaded with logic 1 after the new configuration data is shifted in, signaling that the scan cell is to be set to the PT mode, the PTH latch captures the logic 1 with a pulse on CS applied to its clock (CPT) pin. The output of the PTH latch then dominates the clock pins of the master and slave latches and sets the scan cell to the PT mode.

To ensure reconfigurable scan cells to be set properly, it is recommended that CS pulses do not overlap with those of the scan shift clock. It is also worth noting that, with additional gating blocks, it is also possible to eliminate CS by replacing it with SC. Integration of the PT mode with other types of scan cells, such as those using multiple shift clocks, can be implemented similarly.

Figure 3:
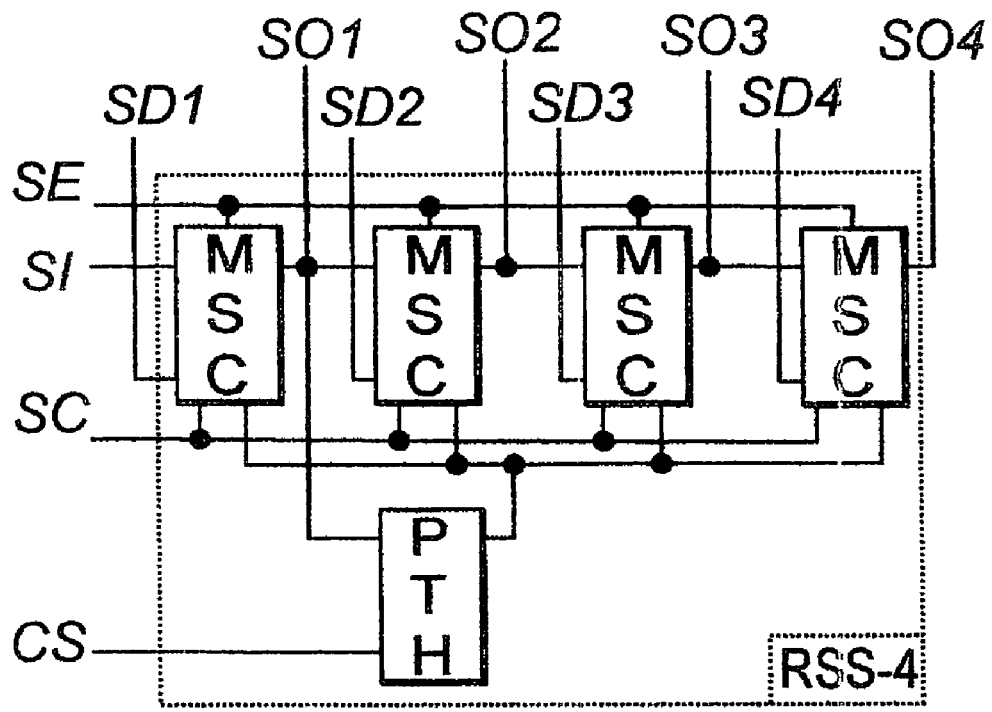
FIG. 3 is a block diagram of an RSS with 4 MSCs.

The hardware overhead, as shown in FIG. 2, comprises the PTH latch and 4 transistors used to replace the two inverters with two 2-input NAND gates for each reconfigurable scan cell and the routing of CS. The hardware overhead can be reduced by using one PTH latch for a number of MSC blocks whose scan shift clock signals are connected together. Together, the MSC blocks and the PTH block form a reconfigurable scan segment (RSS), with the PTH latch taking the first or any other defined position in the segment MSC's SO as its input, as illustrated in FIG. 3, which is a block diagram of an RSS with 4 MSCs.

Figure 4:
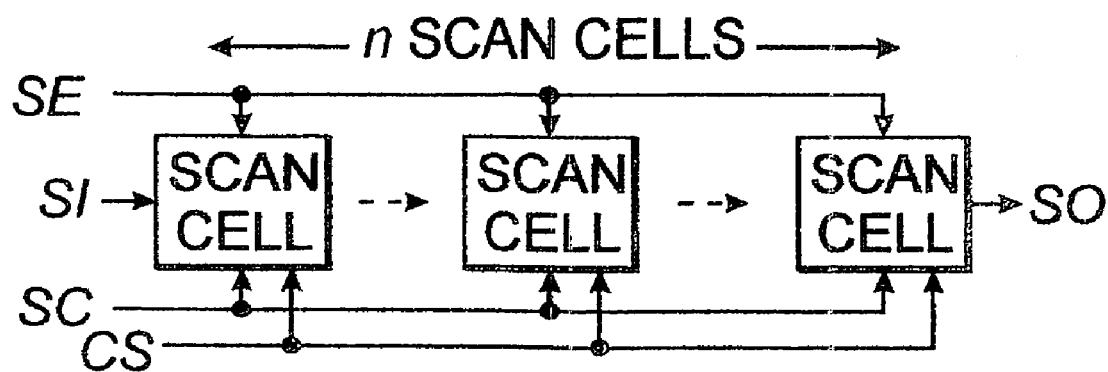
FIG. 4 is an illustration of SLB dynamic serial scan with single-row scan cells.
Figure 5:
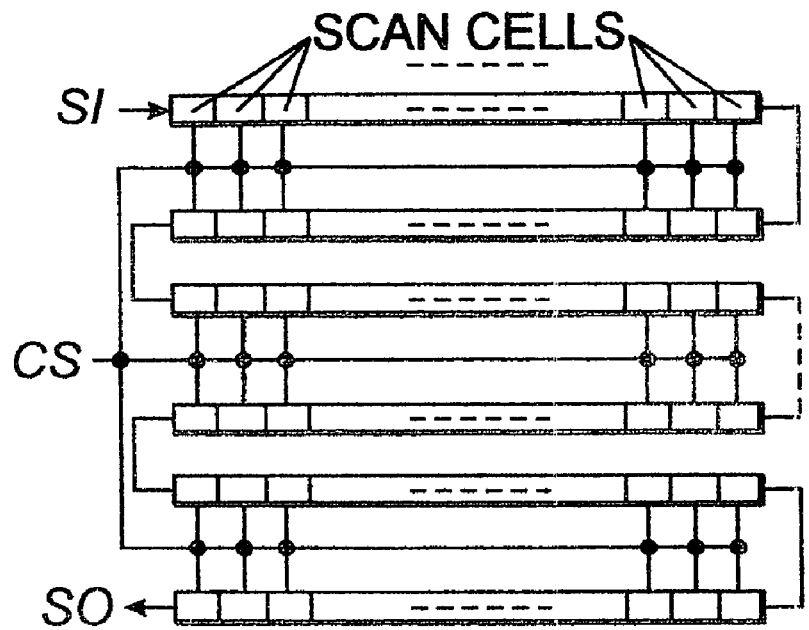
FIG. 5 is an illustration of SLB dynamic serial scan with multi-row scan cells.
Figure 6:
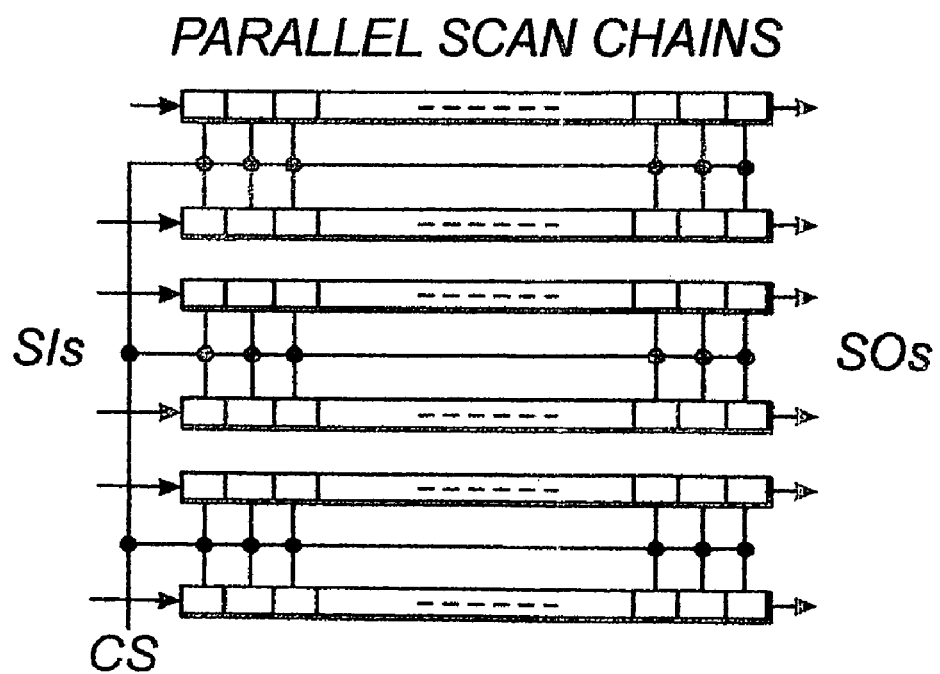
FIG. 6 is an illustration of SLB dynamic parallel scan.

The embodiments of the present invention can be easily integrated with many existing scan methodologies. FIGS. 4, 5, and 6, which are, respectively, an illustration of SLB dynamic serial scan with single-row scan cells, an illustration of SLB dynamic serial scan with multi-row scan cells, and an illustration of SLB dynamic parallel scan, illustrate application of the embodiments of the present invention with classic serial, multi-row serial, and parallel scan methods, respectively. Note that, signal CS is distributed to every reconfigurable scan cells. Therefore, it makes sense that the distribution of the CS signal is integrated with the distribution of the scan shift clock, which is also distributed to all scan cells.

To illustrate the reconfiguration procedure, the notations of some basic scan operations are hereby now defined as follows:

set i: Sets signal i to its desired active value. Control signals are often attributed with their stable-state values as part of their property. For example, if it is defined in the property of signal i that its stable-state value is logic 0, then the active value for i is logic 1.

set i=v: Sets signal i to the specified logic value v.

reset i: Sets signal i to its stable-state.

pulse i: Apply a pulse to signal i.

scan_load(n): Sequentially shifts n bits of data into the scan cells. It is implied that the n bits of data are applied to the SI pin in accordance with the scan (shift) clocks. A data-specific scan_load(n, d1 . . . dn), or scan_load(d1 . . . dn), shifts the n specific data bits into the scan cells.

scan_unload(n): Sequentially shifts out the n bits of data captured in the n scan cells via the SO pin.

scan_unload/load: A scan unload is performed in parallel with its immediate next scan load. Since scan load and unload operations are often performed in pairs, the combined/merged operations reduce the overall scan operation time.

FIG. 7, which is a pseudo-code example of SLB scan reconfiguration procedure, shows an example pseudo-code scan procedure embedded with the embodiments of the present invention reconfiguration. The scan_load of Line 10 shifts new configuration data—referenced as and by <configure_1>—into the n scan cells and the following pulse applied to the CS signal (Line 11) completes the dynamic reconfiguration as specified by configuration_1, in which subsequent scan operations—depicted by the section of Lines 15, 16 and 17, as well as Line 20—are executed until the next SLB reconfiguration.

The next dynamic configuration starts with the scan load of Line 20, with which all of the n_1—specified by configuration_1—scan cells are loaded with logic 0s. Coupled with the following—set SI=0 of Line 21, if required, and—pulse CS at Line 22, it sets the n scan cells to the default scan configuration, ready for loading the next configuration data. Line 23 loads confiruation_i data into the n scan cells, and the following pulse applied to the CS signal (at Line 24) completes the dynamic configuration of configuration_i. Subsequent scan operations are performed in the new configuration specified by configuration_i until another reconfiguration. Note that the set SI=0 at Line 21 would be required if the first scan cell was set to the PT mode in configuration_1. The remaining sections, starting with Line 25, are similar to the early sections and are self explanatory. It is important to note that before the end of the entire scan procedure represented by reset SE at Line 49, all scan cells must be set back to the scan shift mode. This is accomplished by the scan_load at Line 46 and Lines 47, if required, and 48.

The operation time of an SLB dynamic configuration comprises resetting the scan structures to the default configuration (often ignorable due to overlapping with the last scan unload), loading new configuration data and pulsing CS to complete reconfiguration. A typical dynamic scan configuration is illustrated by Lines 20 to 24 in the pseudo-code procedure shown in FIG. 7. The operation time of a dynamic configuration is dominated by the scan_load of Lines 23. The scan load of Line 20, as well as Line 21, is to reset the scan structures to the default configuration and its operation overlaps with the scan unload of Line 20. Multiplying this operation time with the number of dynamic configurations, the resulting number is the up bound of the estimated total operation time overhead due to all SLB dynamic configurations. The SLB reconfiguration time overhead can be largely minimized when all required configurations are pre-analyzed for set-subset relationships and dynamic configurations are applied in that identified set-subset order. When configuration_j is a smaller set of configuration_i, the reconfiguration time overhead for configuration_j can be largely eliminated by ordering configuration_j to occur after configuration_i, hence, eliminating the need of Lines 23 and 24. With the example shown in FIG. 7, assuming that configuration_i is a smaller set of configuration_1, then Line 20 can be replaced with the following:

20 scan_unload(n_1)/load(n_1, <configuration_i>);

and Lines 23 and 24 are therefore no longer needed. The operation time overhead of configuration_i is then minimized to the scan load of Line 20, whose operation overlaps with the scan unload of Line 20. The example and analysis show that the operation time overhead of SLB dynamic scan configuration can be minimized or eliminated.

Although the pseudo-code procedure describes the scan operations of an SSC, it is applicable to parallel scan structures as well. This is because, as illustrated in FIG. 6, parallel scan often comprise multiple SSCs of the same lengths. For parallel scan structures comprising SSCs with different length, specific configuration data can be loaded into corresponding SSCs before a pulse is applied to CS, resulting in a unified reconfiguration procedure.

B. The Method.

As shown in FIGS. 11A-11B, which are a flow chart of the method of dynamically configuring scan structures of the embodiments of the present invention, to dynamically configure scan structures, the following steps are taken:

STEP 1: A hardware design must replace standard scan cells with reconfigurable scan cells on silicon, as well as routing the CS signal to all reconfigurable scan cells. Although it is preferred to use one PT Hold latch for each reconfigurable scan cell, a PT Hold latch can be used with a set of reconfigurable scan cells resulting in using less silicon overhead but losing in the capability of fine-grain reconfiguration.

STEP 2: Set SE to logic 1 so that the scan mode is activated.

STEP 3: Load desired configuration data into the default scan configuration setup, in no scan cell is in the PT mode, via scan-load (a.k.a. scan-in) operation.

STEP 4: Apply a pulse to the CS signal to complete the setup of the desired scan configuration. All subsequent scan operations will be performed in this new configuration until the next reconfiguration takes place. In principle, STEP 3 and STEP 4 can be repeated many times to exercise desired configurations. Depending on the exact design implementation and the exact order of all desired reconfigurations to be exercised, however, additional steps may be required to reset all reconfigurable scan cells to non-PT state before reconfigurations take place.

STEP 5: Reset all configurable scan cells to non-PT mode. The objective is to clear the PT Hold value in all PT Hold latches. This can be achieved in a number of ways. If the PT Hold latches have RESET, apply the RESET followed by a pulse on the CS signal; or scan load all-0 to the last scan configuration and set all SI inputs to logic 0 followed by applying a pulse on CS.

STEP 6: Set SE to logic 0. This brings all scan structures back to their original state before STEP 2.

Note that the above procedure describes a typical sequence of dynamically configuring the scan structures as there can be other variations.

C. The Examples.

For ASIC implementations, individual ASIC designs may be implemented on silicon solutions containing more scan resources than the ASIC designs need. The embodiments of the present invention can reconfigure the scan resources to tailor individual designs, such that the reconfigured scan structures are set in the most efficient configurations. The resulting scan configurations would function as if they were tailor-made for the individual designs.

Figure 8:
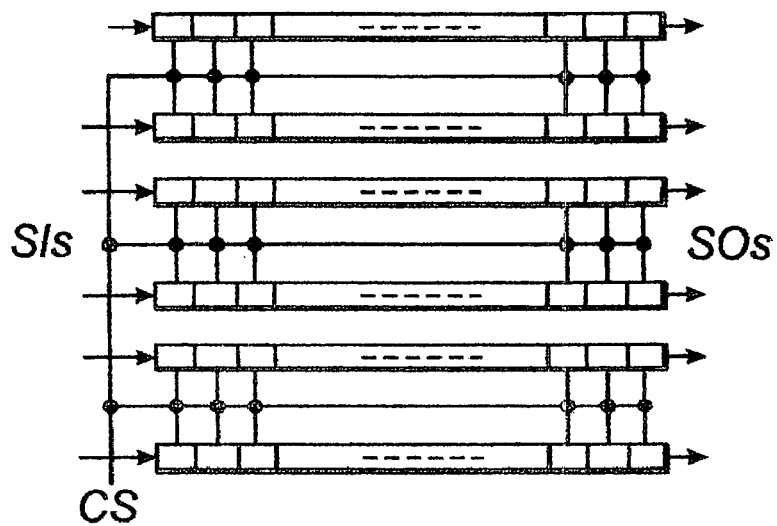
FIG. 8 is an ASIC implementation example with embodiments of the present invention reconfiguration.

Consider the example of a silicon implementation platform containing 6 parallel scan chains implemented with embodiments of the present invention technology. Each of the 6 SSCs comprises n scan cells. Assuming that an ASIC design X to be implemented on this silicon platform uses the 6 parallel scan chains for post-silicon applications, but with a shorter length of m, where m=n/2. For the simplicity of this example, it is also assumed that design X would use every other scan cell in the 6 SSCs—meaning each scan cell in the shift mode is followed by one to be set into the PT mode. FIG. 8, which is an ASIC implementation example with embodiments of the present invention reconfiguration, depicts the 6 parallel scan chains implemented on the silicon with the embodiments of the present invention, as well as an example scan operation procedure which begins with the embodiments of the present invention's reconfiguration procedure that configures the scan resources to design X's specification.

To configure the 6 parallel scan chain resources for design X, the scan operation procedure starts with Line 1, at which the scan mode is enabled. The 6 parallel scan operations noted by the scan_load_6 operator at Line 2 load design X scan configuration data into the scan cells, followed by a pulse applied to CS at Line 3 to complete the configuration. Parallel scan shift operations start at Line 4, until Line 8. The scan load operations at Line 8, followed by a pulse applied to CS at Line 9, reset the scan structures to the default configuration, while Line 10 disables the scan mode and concludes the scan procedure. Each of the scan chain resources can be reconfigured to different length, simply by loading desired configuration data into respective scan chains at Line 2. Also note that, if a process uses multiple scan sections, resetting the scan resources to the default configuration only needs to be performed at the end of the last scan section.

For dynamic scan configuration, the embodiments of the present invention's reconfiguration time can be minimized or eliminated by identifying set-subset relations among the configurations, and then apply reconfigurations in the set-subset order. When scan cells, as opposed to cells in the PT mode, of the next configuration are in the current configuration, the reconfiguration time overhead is minimized to the time of applying a pulse on CS. This is because the new configuration data can be shifted into the scan cells in parallel with the last scan-unload in the current configuration.

Figure 9A:
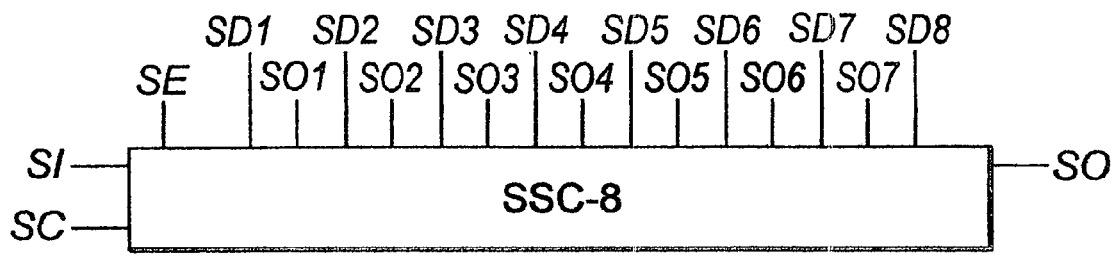
FIG. 9(a) is an 8-bit MUX-based serial scan block.
Figure 9B:
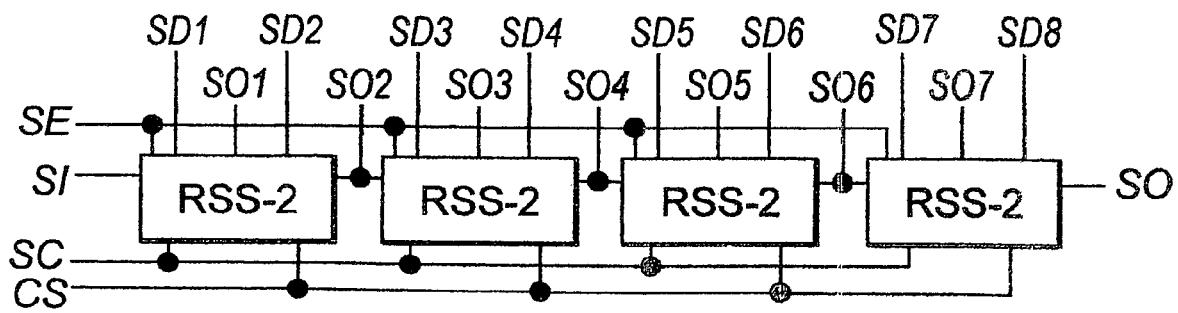
FIG. 9(b) is 8-bit 4×2 embodiments of the present invention structural block.

For simplicity, consider a classic MUX-based SSC of 8 scan cells, as shown in FIG. 9 (a), which is an 8-bit MUX-based serial scan block. FIG. 9(b), which is 8-bit 4×2 embodiments of the present invention structural block, shows embodiments of the present invention implementation, with 4 RSS-2s, each comprises 2 MSCs and 1 PTH latch. FIG. 10, which is a pseudo-code example of SLB dynamic scan configuration with an 8-bit 4×2 embodiments of the present invention block, illustrates the dynamic scan configuration process in pseudo-code. It starts with the default scan configuration, in which all of the 8 scan cells are in the scan shift mode, as Lines 1, 2, 3, 5, 6, and 5 illustrate. Configuration #1 sets scan cells 1 and 2, i.e., the first RSS-2 block from left, to the PT mode, while Configuration 2 adds scan cells 5 and 6, i.e., the third RSS-2 block, to the PT-mode list. Note that Line 23 is necessary to ensure that scan cells 1 and 2 of the first RSS-2 block stay in the PT mode during and after the second reconfiguration. Lines 33, 34 and 35 reset the scan structure to the default configuration, while Lines 36 and 38 enable Configuration 3, in which scan cells 3 and 4 of the second RSS-2 block are set to the PT mode. Here, resetting the scan structures to the default configuration is necessary, because Configuration #3 is not a subset of Configuration #2. Configuration 4 sets scan cells 5 and 6 of the fourth RSS-2 block to the PT mode. Lines 58 and 59 set all scan cells back to the shift mode, before Line 60 closing the scan procedure.

SLB scan reconfiguration concept can be applied to multi-clock scan structures as well.

D. The Impressions.

The embodiments of the present invention employ one global signal for reconfiguration control and the scan-load operation to distribute configuration data to reconfigurable scan cells. It avoids difficulties often associated with routing a number of configuration signals used by MUX-based and RAS methods. It requires that each reconfigurable scan cell or segment to have a PT mode, in which the SI input of the scan cell passes freely to its SO output. Integration of the PT mode with scan cells is illustrated with a typical MUX-based scan D-flipflop by replacing the two inverters connected to the shift clock with two 2-input NAND gates. A PTH latch is used for each reconfigurable scan cell or segment to hold the PT state. The reconfiguration procedure employs the standard scan load operation to shift configuration data into the scan cells, followed a pulse applied to the global configuration set signal that sets the new configuration into effect. Subsequent scan operations are performed in the new configuration until it is reconfigured again. Examples of the embodiments of the present invention reconfiguration procedures embedded in typical scan operations are illustrated.

The simplicity of the embodiments of the present invention, with the architecture, circuit structures, and reconfiguration procedures, is unmatched by existing reconfigurable scan methods. The embodiments of the present invention define a scan-load-based dynamic scan configuration that reconfigures scan structures via scan-load operation, to thereby eliminate interconnect network distributing configuration signals suitable to be deployed on ASIC implementation platforms as common scan structures yet reconfigurable for individual designs.

It will be understood that each of the elements described above or two or more together may also find a useful application in other types of constructions differing from the types described above.

While the embodiments of the present invention have been illustrated and described as embodied in a scan-load-based dynamic scan configuration, however, they are not limited to the details shown, since it will be understood that various omissions, modifications, substitutions, and changes in the forms and details of the embodiments of the present invention illustrated and their operation can be made by those skilled in the art without departing in any way from the spirit of the embodiments of the present invention.

Without further analysis the foregoing will so fully reveal the gist of the embodiments of the present invention that others can by applying current knowledge readily adapt it for various applications without omitting features that from the standpoint of prior art fairly constitute characteristics of the generic or specific aspects of the embodiments of the present invention.

The invention claimed is:

1. A scan-load-based dynamic scan configuration, comprising:
   a) reconfigurable scan cells;
   b) means for distributing configuration data to said reconfigurable scan cells and for determining desired reconfiguration data for each of said reconfigurable scan cells; and
   c) a configuration-set (CS) signal;
   wherein each of said reconfigurable scan cells has a pass-through (PT) mode in which a data input, either a scan-in (SI) or a system-data (SD) of the scan cell, is transparently passed to a scan-out (SO) terminal of the scan cell without requiring a pulse on a shift clock (SC);
   wherein said configuration-set (CS) signal communicates with each of said reconfigurable scan cells; and
   wherein a pulse on said configuration-set (CS) signal triggers PT Hold latches to capture configuration data from corresponding slave latches, which in turn set configurations of each of said reconfigurable scan cells.

2. The architecture of claim 1, wherein said reconfigurable scan cells are loaded with configuration data via a scan-load operation;
   wherein said reconfigurable scan cells having logic 1s are set to PT mode; and
   wherein said reconfigurable scan cells having logic 0s are not set to said PT mode.

3. The architecture of claim 2, wherein said configuration-set (CS) signal has a pulse thereon capturing said configuration data into said PT hold latches such that those PT hold latches having logic is disable said shift clock (SC) connected to the master and slave latches of corresponding reconfigurable scan cells therefore setting these reconfigurable scan cells to said PT mode.

4. The architecture of claim 2, wherein said reconfigurable scan cells are released from said PT mode by letting reconfigurable scan cells capturing logic 0s through the data input, either said scan-in (SI) or said system data (SD), followed by a pulse applied to the configuration-set (CS) signal.

5. The architecture of claim 4, wherein a pulse on said configuration-set (CS) signal triggers said PT Hold latch which captures said logic 0, which in turn frees said shift clock (SC) from PT Hold gating to arrive at clock pins of the master and slave latches and set said reconfigurable scan cells back to either normal scan shift or functional mode.

6. The architecture of claim 5, wherein said PT hold latch takes input from Q-bar output of said slave latch or one output of said master latch.

7. The architecture of claim 2, wherein said PT hold latches capture logic 1s to set reconfigurable scan cells to said PT mode.

8. A method of dynamically configuring scan structures, comprising the steps of:
   a) replacing standard scan cells with reconfigurable scan cells;
   b) routing a configuration-set (CS) signal to all reconfigurable scan cells;
   c) setting scan enable (SE) signal to logic 1 so that scan mode is activated;
   d) loading desired configuration data into reconfigurable scan cells in the initial default scan configuration via scan-load operation;
   e) applying a pulse to the configuration-set (CS) signal to complete setup of desired scan configuration;
   f) resetting all configurable scan cells to a non-PT mode by clearing PT Hold value in all PT Hold latches; and
   g) setting scan enable (SE) signal to logic 0 bringing all scan structures back to their original state.

9. The method of claim 8, wherein each of said PT Hold latches is used for each reconfigurable scan cell.

10. The method of claim 8, wherein one of said PT Hold latches can be used with a set of modified scan cells resulting in using less silicon overhead.

11. The method of claim 8, wherein said resetting step is accomplished by following an all-0 configuration data load (CDL) RESET with a pulse on the configuration-set (CS) signal.

12. The method of claim 8, wherein said resetting step is accomplished by scan loading all-0 to last scan configuration and set all scan in (SI) inputs to logic 0 followed by applying a pulse on the configuration-set (CS) signal.

* * * * *